(12) United States Patent
Mu et al.

(10) Patent No.: US 10,141,194 B1
(45) Date of Patent: Nov. 27, 2018

(54) MANUFACTURING METHOD OF SEMICONDUCTOR STRUCTURE

(71) Applicant: UNITED MICROELECTRONICS CORP., Hsin-Chu (TW)

(72) Inventors: Zhi Qiang Mu, Singapore (SG); Chow Yee Lim, Singapore (SG); Hui Yang, Singapore (SG); Yong Bin Fan, Singapore (SG); Jianjun Yang, Singapore (SG); Chih-Chien Chang, Hsinchu (TW)

(73) Assignee: UNITED MICROELETRONICS CORP., Hsin-Chu (TW)

( * ) Notice: Subject to any disclaimer, the term of this patent is extended or adjusted under 35 U.S.C. 154(b) by 0 days.

(21) Appl. No.: 15/603,465

(22) Filed: May 24, 2017

(51) Int. Cl.
| H01L 21/28 | (2006.01) |
| H01L 21/02 | (2006.01) |
| H01L 29/49 | (2006.01) |
| H01L 29/51 | (2006.01) |

(52) U.S. Cl.
CPC .. *H01L 21/28273* (2013.01); *H01L 21/02071* (2013.01); *H01L 21/02074* (2013.01); *H01L 29/4916* (2013.01); *H01L 29/513* (2013.01); *H01L 29/518* (2013.01)

(58) Field of Classification Search
CPC .............................................. H01L 21/28273
USPC ........................................................ 438/591
See application file for complete search history.

(56) References Cited

U.S. PATENT DOCUMENTS

| | | | | |
|---|---|---|---|---|
| 2005/0003616 | A1* | 1/2005 | Lutze | H01L 21/28273 438/258 |
| 2005/0130326 | A1* | 6/2005 | Lee | C23C 16/405 438/3 |
| 2006/0183284 | A1* | 8/2006 | Sasago | G11C 16/0491 438/257 |
| 2007/0090445 | A1* | 4/2007 | Lee | H01L 27/115 257/315 |
| 2011/0139004 | A1* | 6/2011 | Jacobsen | B01D 45/12 95/216 |
| 2013/0168743 | A1* | 7/2013 | Dove | H01L 21/28114 257/288 |
| 2017/0194151 | A1* | 7/2017 | Zhang | H01L 21/26513 |

* cited by examiner

Primary Examiner — Igwe U Anya
(74) Attorney, Agent, or Firm — Winston Hsu

(57) ABSTRACT

A manufacturing method of a semiconductor structure includes the following steps. A first polysilicon layer is formed on a substrate. A planarization process to the first polysilicon layer is performed. A first etching back process to the first polysilicon layer is performed after the planarization process. A second etching back process to the first polysilicon layer is performed after the first etching back process. A first wet clean process to the first polysilicon layer is performed after the first etching back process and before the second etching back process.

11 Claims, 5 Drawing Sheets

MANUFACTURING METHOD OF SEMICONDUCTOR STRUCTURE

BACKGROUND OF THE INVENTION

1. Field of the Invention

The present invention relates to a manufacturing method of a semiconductor structure, and more particularly, to a manufacturing method of a semiconductor structure for reducing particle-induced defects.

2. Description of the Prior Art

The development of semiconductor integrated circuit technology progresses continuously and circuit designs in products of the new generation become smaller and more complicated than those of the former generation. The amount and the density of the functional devices in each chip region are increased constantly according to the requirements of innovated products, and the size of each device has to become smaller accordingly. As the size of the device becomes smaller, influence of defects induced by impurities generated during the manufacturing processes may become more serious, and the manufacturing yield may be affected accordingly.

SUMMARY OF THE INVENTION

According to the claimed invention, a manufacturing method of a semiconductor structure is provided. The manufacturing method includes the following steps. A planarization process to the first polysilicon layer is performed. A first etching back process to the first polysilicon layer is performed after the planarization process. A second etching back process to the first polysilicon layer is performed after the first etching back process. A first wet clean process to the first polysilicon layer is performed after the first etching back process and before the second etching back process.

In the manufacturing method of the semiconductor structure in the present invention, two etching back processes are applied for thinning the first polysilicon layer after the planarization process performed to the first polysilicon layer. The first etching back process is configured to expose impurities embedded in the first polysilicon layer after the planarization process, and the first wet clean process performed between the first etching back process and the second etching back process is configured to remove the impurities before the second etching back process which is configured to reduce the thickness of the first polysilicon layer to a target value. Defects induced by the impurities may be reduced, and the manufacturing yield may be enhanced accordingly.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 2-8 are schematic drawings illustrating the manufacturing method of the semiconductor structure according to the first embodiment of the present invention, wherein FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, and FIG. 8 is a schematic drawing in a step subsequent to FIG. 7.

DETAILED DESCRIPTION

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have been described in detail in order to avoid obscuring the invention.

It will be understood that when an element is referred to as being "formed" on another element, it can be directly or indirectly, formed on the given element by growth, deposition, etch, attach, connect, or couple. And it will be understood that when an elements or a layer is referred to as being "on", "connected to", or "coupled to" another element or layer, it can be directly on, connected or coupled to the other element or layer or intervening elements or layers may be present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer and/or section from another. Thus, a first element, component, region, layer or section discussed below could be termed a second element, component, region, layer or section without departing from the teachings of the disclosure.

Figure 1:
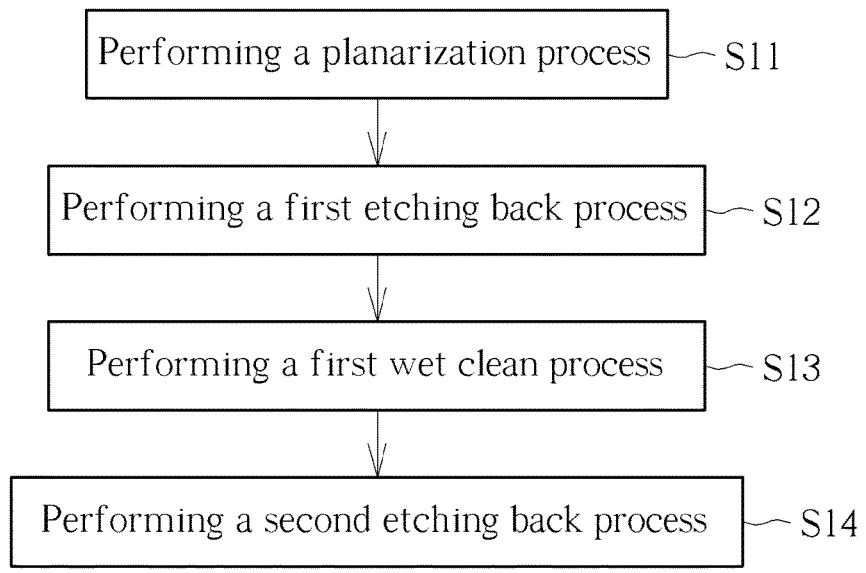
FIG. 1 is a flow chart of a manufacturing method of a semiconductor structure according to a first embodiment of the present invention.
Figure 2:
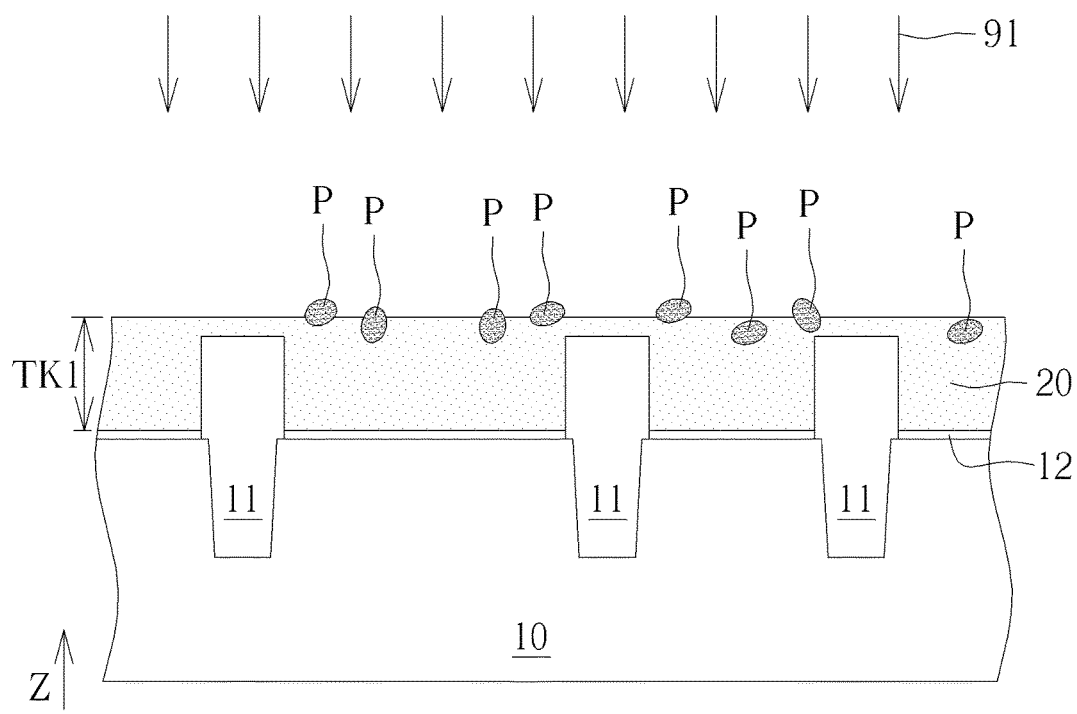

Please refer to FIGS. 1-8. FIG. 1 is a flow chart of a manufacturing method of a semiconductor structure according to a first embodiment of the present invention, and FIGS. 2-8 are schematic drawings illustrating the manufacturing method of the semiconductor structure in this embodiment. The manufacturing method of the semiconductor structure in this embodiment includes the following steps. As shown in FIG. 2, a first polysilicon layer 20 is formed on a substrate 10. The first polysilicon layer 20 may be formed by a deposition process such as a chemical vapor deposition (CVD) process or other suitable process. The substrate 10 may include a semiconductor substrate such as a silicon substrate, an epitaxial substrate, a silicon carbide substrate, or a silicon-on-insulator (SOI) substrate, but not limited thereto. In some embodiments, a plurality of isolation structures 11 and a dielectric layer 12 may be formed before the step of forming the first polysilicon layer 20. The isolation structures 11 may be formed by filling trenches in the substrate 10 with an insulation material and performing a chemical mechanical polishing process and an etching back process to the substrate 10 for exposing an upper portion of each of the isolation structure 11, but not limited thereto. The insulation material of the isolation structures 11 may include silicon oxide, silicon nitride, silicon oxynitride, or other suitable insulation materials, and the isolation structures 11 may be regarded as shallow trench isolations (STIs), but not limited thereto. The dielectric layer 12 may be an oxide layer formed between the first polysilicon layer 20 and the substrate 10, but not limited thereto. In other words, the first polysilicon layer 20 may be formed and cover the isolation structures 11 and the dielectric layer 12 in a vertical direction Z, and the vertical direction Z may be regarded as a thickness direction of the substrate 10.

As shown in FIG. 1 and FIG. 2, in step S11, a planarization process 91 to the first polysilicon layer 20 is performed. The first polysilicon layer 20 may have a first thickness TK1 after the planarization process 91. In some embodiments, the planarization process 91 may include a chemical mechanical polishing (CMP) process or other suitable planarization processes. In some embodiments, the isolation structures 11 may be a stop layer of the chemical mechanical polishing process, but not limited thereto. Some impurities, such as particles P, may remain on the first polysilicon layer 20 after the planarization process 91. Some of the particles P may be partially embedded or fully embedded in the first polysilicon layer 20 after the planarization process 91 and it is hard to remove the particles P embedded in the first polysilicon layer 20 by normal clean processes. In some embodiments, the particles P remained on the first polysilicon layer 20 after the planarization process 91 may be too small to be detected by inspection tools, but defects such as nodules generated by the embedded particles P may become relatively larger after processes performed subsequently, and the manufacturing yield will be seriously influenced by the nodule defects. Therefore, the particles P have to be removed before subsequent processes, such as a process of forming another material layer on the first polysilicon layer 20.

Figure 3:
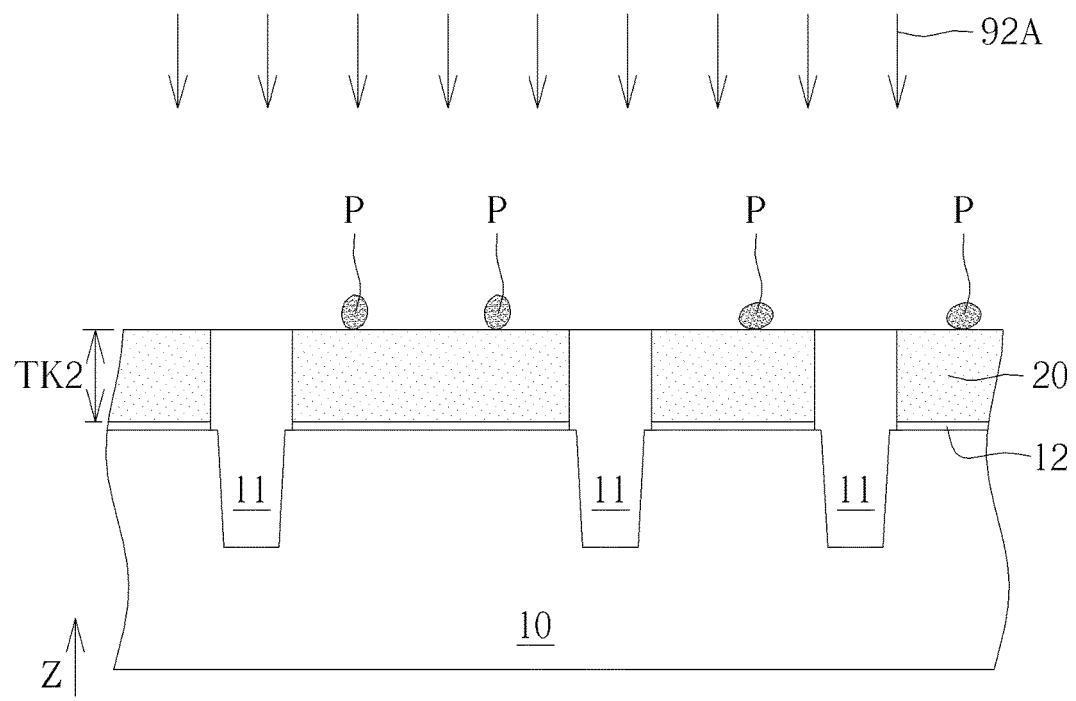

As shown in FIG. 1, FIG. 2, and FIG. 3, in step S12, a first etching back process 92A to the first polysilicon layer 20 is performed after the planarization process 91. The first etching back process 92A is configured to remove a part of the first polysilicon layer 20 and expose the particles P embedded in the first polysilicon layer 20 after the planarization process 91. In other words, the particle P at least partially embedded in the first polysilicon layer 20 is formed after the planarization process 91 and before the first etching back process 92A, and the particle P at least partially embedded in the first polysilicon layer is further exposed by the first etching back process 92A. The first etching back process 92A may be regarded as a process for digging out the particles P embedded in the first polysilicon layer 20. The first polysilicon layer 20 may have a second thickness TK2 after the first etching back process 92A, and the second thickness TK2 is less than the first thickness TK1. In some embodiments, a part of each of the isolation structures 11 may also be removed by the first etching back process 92A, but not limited thereto.

Figure 4:
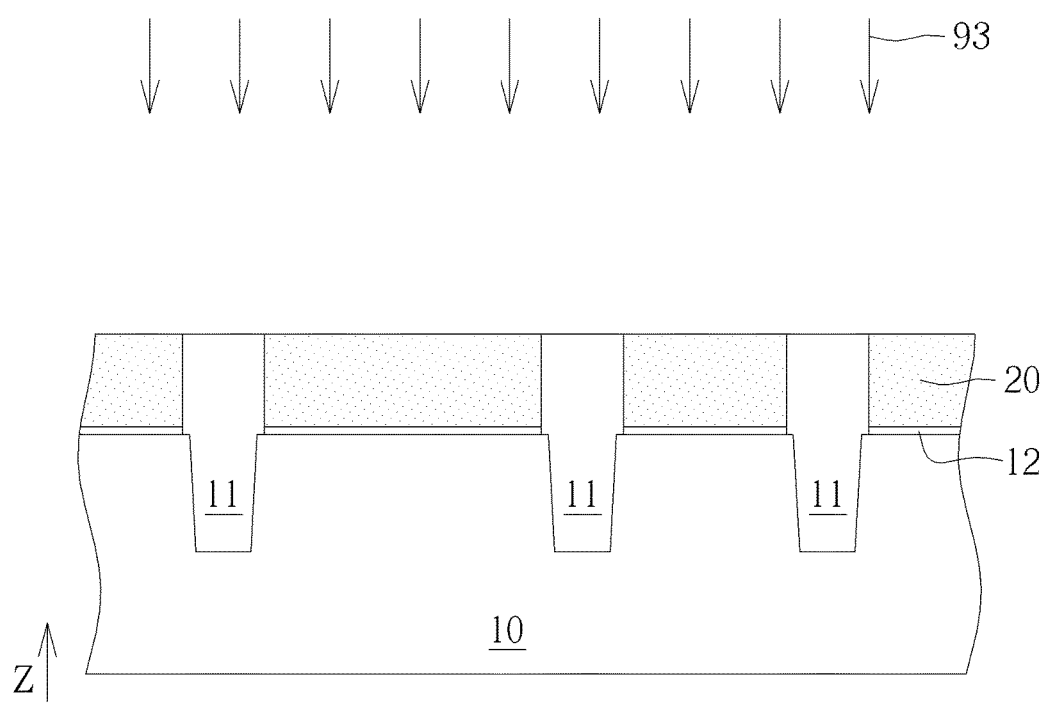

As shown in FIG. 1, FIG. 3, and FIG. 4, in step S13, a first wet clean process 93 to the first polysilicon layer 20 is performed after the first etching back process 92A. The first wet clean process 93 is configured to remove impurities such as particles. The particles P embedded in the first polysilicon layer 20 and at least partially exposed and/or dug out by the first etching back process 92A may be removed by the first wet clean process 93. In some embodiments, a solution used in the first wet clean process 93 may include dilute hydrofluoric acid (DHF), sulfuric acid, or other suitable chemicals.

As shown in FIG. 1, FIG. 3, FIG. 4, and FIG. 5, in step S14, a second etching back process 92B to the first polysilicon layer 20 is performed after first wet clean process 93. In other words, the second etching back process 92B is performed after the first etching back process 92A, and the first wet clean process 93 is performed after the first etching back process 92A and before the second etching back process 92B. The second etching back process 92B is configured to reduce the thickness of the first polysilicon layer 20 to a target value, such as a third thickness TK3 show in FIG. 5, but not limited thereto. In other words, an original etching back process for thinning the first polysilicon layer 20 to the third thickness TK3 may split into the first etching back process and the second etching back process 92B in the present invention. The first etching back process may be used to expose the particles embedded in the first polysilicon layer 20, and the first wet clean process 93 performed between the first etching back process and the second etching back process 92B may be used to remove the particles. Nodule defects which may be formed after the etching back process performed to the first polysilicon layer 20 and induced by the particles embedded in the first polysilicon layer 20 may be reduced, and the manufacturing yield may be enhanced accordingly. In addition, as shown in FIGS. 2-5, in some embodiments, the difference between the first thickness TK1 and the second thickness TK2 may be smaller than the difference between the second thickness TK2 and the third thickness TK3 for improving the thickness uniformity of the first polysilicon layer 20 after the second etching back process 92B, but not limited thereto. The ratio of the process time of the first etching back process 92A to the process time of the second etching back process 92B may be modified according to the size of the particles P and the depth of the particles P embedded in the first polysilicon layer 20 before the first etching back process 92A. The process conditions of the second etching back process 92B may also be modified according to the thickness distribution result of the first polysilicon layer 20 after the first etching back process 92A and the first wet clean process 93, and the thickness of the first polysilicon layer 20 may be controlled more precisely.

Figure 5:
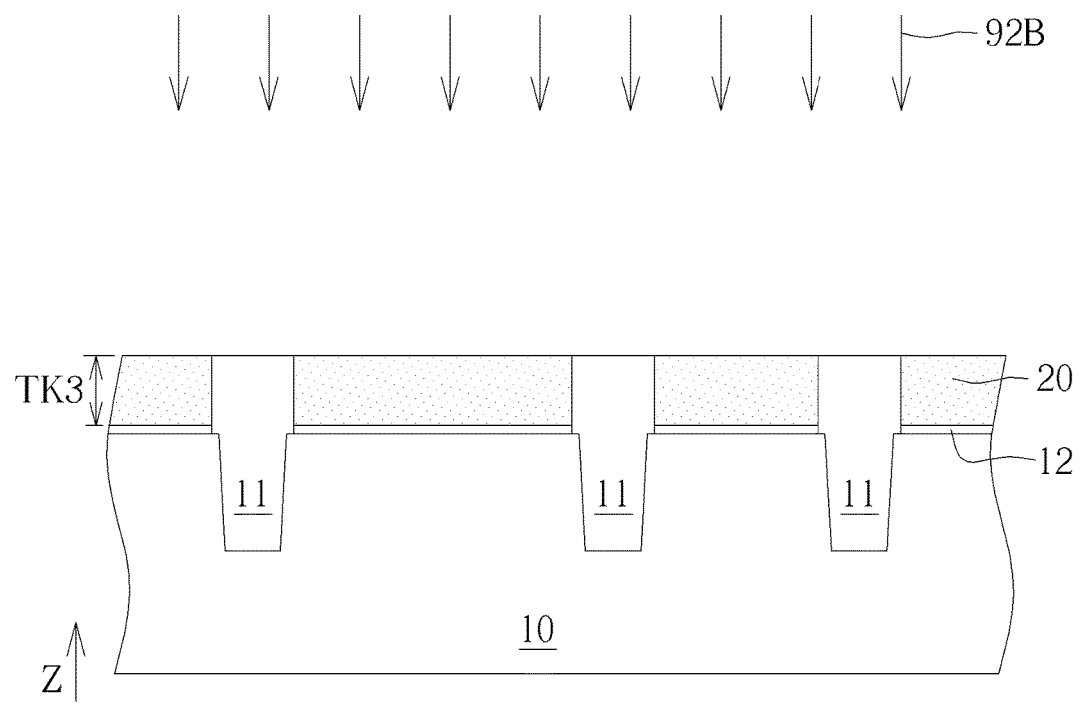
Figure 6:
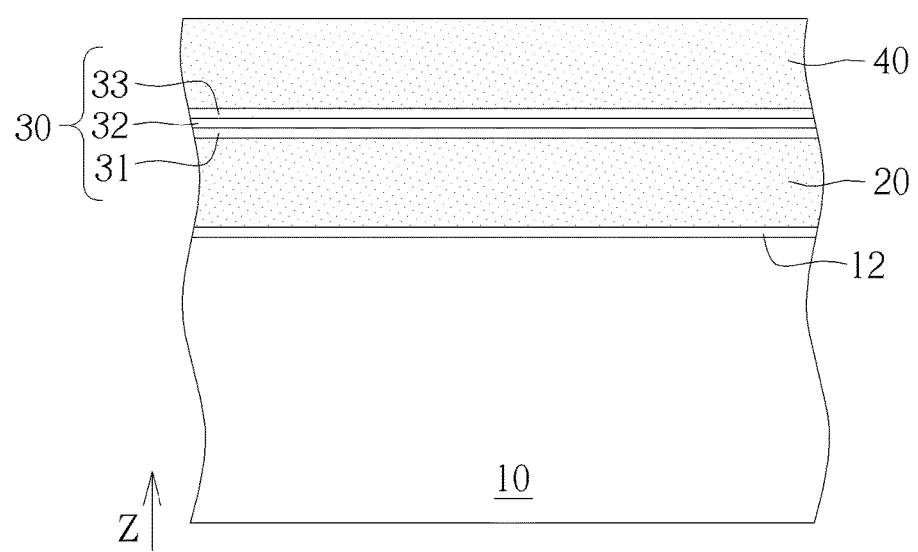
Figure 8:
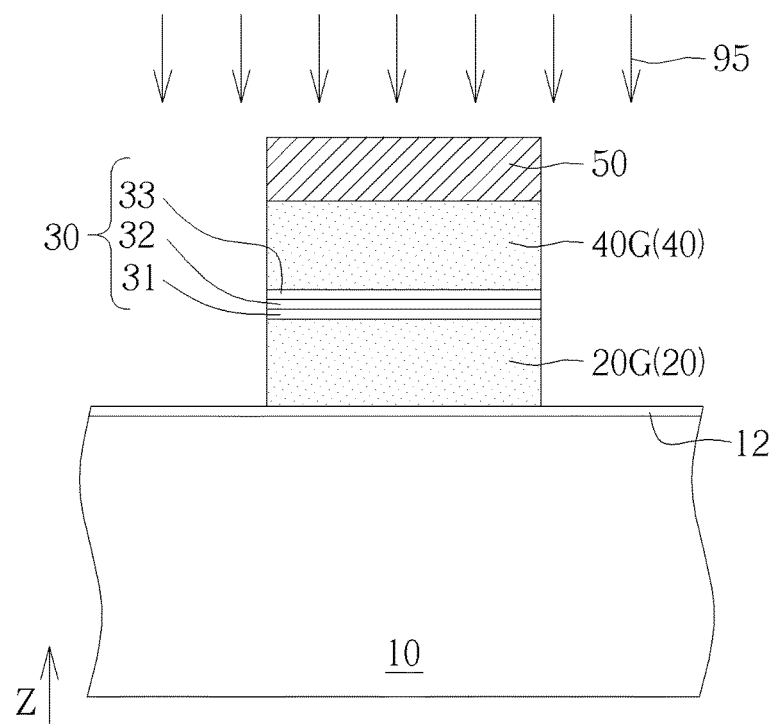

As shown in FIG. 5 and FIG. 8, in some embodiments, a first patterning process 95 to the first polysilicon layer 20 may be performed after the second etching back process 92B, and at least a part of the first polysilicon layer 20 may be patterned to be a floating gate 20G of a semiconductor memory device, but not limited thereto. In some embodiments, the first polysilicon layer 20 may also be patterned to be other parts of a semiconductor structure, such as a polysilicon gate and/or a dummy gate for forming a metal-oxide-semiconductor (MOS) device. As shown in FIG. 5 and FIG. 6, in some embodiments, a dielectric layer 30 may be formed on the first polysilicon layer 20 after the second etching back process 92B, and a second polysilicon layer 40 may be formed on the dielectric layer 30. In some embodiments, the dielectric layer 30 may include an oxide-nitride-oxide (ONO) multilayered structure including a first oxide layer 31, a nitride layer 32, and a second oxide layer 33 disposed overlapping one another sequentially in the vertical direction Z, but not limited thereto.

Figure 7:
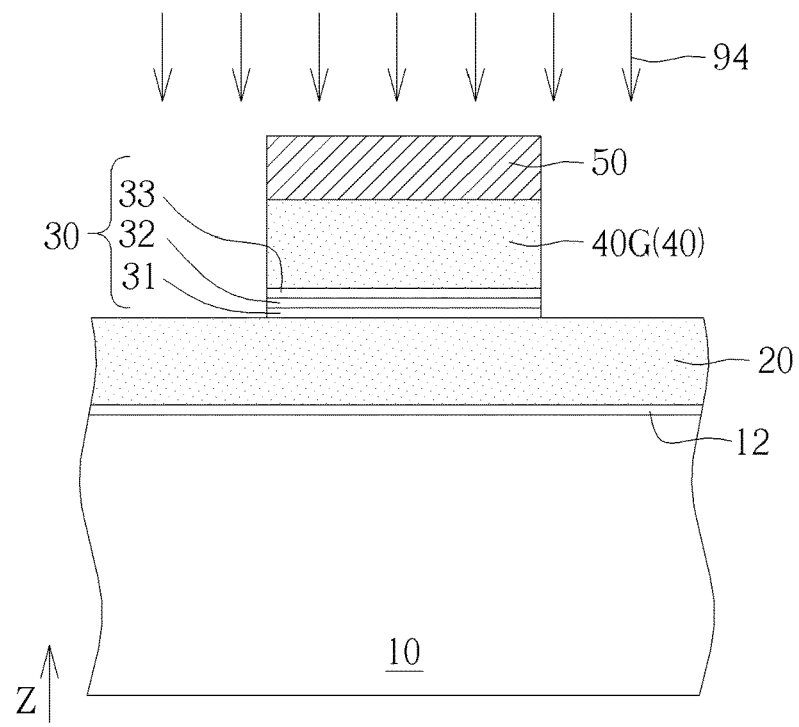

As shown in FIG. 7 and FIG. 8, a mask layer 50 may be formed on the second polysilicon layer 40, and a second patterning process 94 may be performed with the mask layer 50 as a mask. In some embodiments, the second patterning process 94 may be performed to the second polysilicon layer 40, and at least a part of the second polysilicon layer 40 may be patterned to be a control gate 40G of a semiconductor memory device, but not limited thereto. In some embodiments, the second polysilicon layer 40 may also be patterned to be other parts of a semiconductor structure. Additionally, in some embodiments, the dielectric layer 30 may also be patterned by the second patterning process 94 to be a self-aligned patterned ONO structure, but not limited thereto. In some embodiments, the first patterning process 95 for forming the floating gate 20G may be performed after the second patterning process 94 for forming the control gate 40G. In other words, the floating gate 20G may be formed after the step of forming the control gate 40G, but not limited thereto. The mask layer 50 may also be used as a mask in the first patterning process 95, and the floating gate 20G may also be a self-aligned floating gate, but not limited thereto. In some embodiments, the second patterning process 94 and the first patterning process 95 may be integrated into one patterning process, but not limited thereto. In some embodiments, the floating gate 20G may be formed before the step of forming the control gate 40G and/or a projection area of the floating gate 20G in the vertical direction Z may be different from a projection area of the control gate 40G in the vertical direction Z. In some embodiments, the floating gate 20G may electrically floating without being connected with any conductive line, and charges may be stored in the floating gate 20G during an operation of a memory cell including the floating gate 20G, the control gate 40G, and the dielectric layer 30, but not limited thereto.

Figure 9:
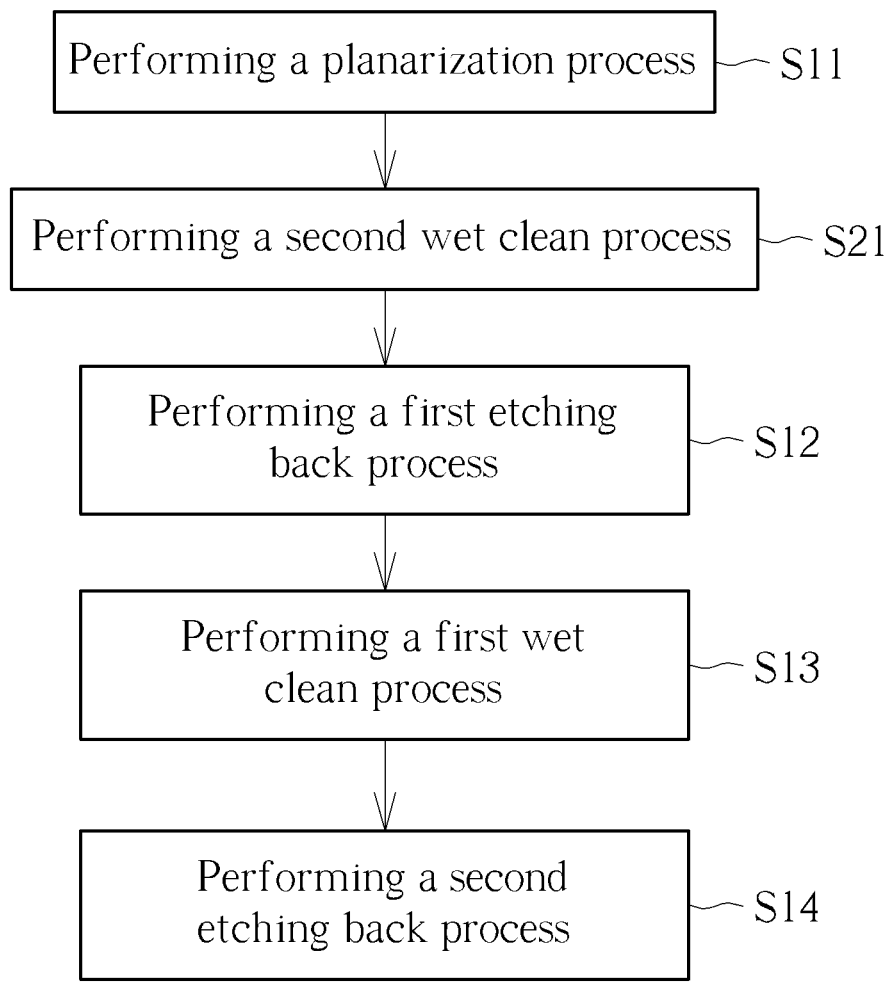
FIG. 9 is a flow chart of a manufacturing method of a semiconductor structure according to a second embodiment of the present invention.

Please refer to FIG. 9 and FIGS. 1-3. FIG. 9 is a flow chart of a manufacturing method of a semiconductor structure according to a second embodiment of the present invention. As shown in FIG. 9 and FIGS. 1-3, in the manufacturing method of this embodiment, step S21 is performed after the step S11 and before the step S12. In the step S21, a second wet clean process to the first polysilicon layer 20 is performed after the planarization process 91 and before the first etching back process 92A. In some embodiments, a solution used in the second wet clean process may include sulfuric acid, hydrogen peroxide, or other suitable chemicals. For example, the solution used in the second wet clean process may include a mixture of sulfuric acid and hydrogen peroxide, and the second wet clean process may be regarded as a SPM (sulfuric acid and hydrogen peroxide mixture) clean process or a Caroz clean process, but not limited thereto. The second wet clean process may be used to remove some impurities before the first etching back process 92A for reducing the related defects and enhancing the manufacturing yield.

To summarize the above descriptions, according to the manufacturing method of the semiconductor structure in the present invention, the etching back process for thinning the first polysilicon layer splits into the first etching back process and the second etching back process. The first etching back process may be used to expose and/or dig out the particles embedded in the first polysilicon layer after the planarization process. The first wet clean process 93 performed after the first etching back process may be used to remove the particles embedded in the first polysilicon layer and at least partially exposed and/or dug out by the first etching back process. The second etching back process performed after the first wet clean process may be used to reduce the thickness of the first polysilicon layer to the target value. The nodule defects formed after the second etching back process and induced by the particles embedded in the first polysilicon layer may be reduced accordingly, and the manufacturing yield may be improved. Additionally, the process conditions of the second etching back process may be modified according to the thickness distribution result of the first polysilicon layer after the first etching back process and the first wet clean process, and the thickness control of the first polysilicon layer may be further improved accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A manufacturing method of a semiconductor structure, comprising:
   forming a first polysilicon layer on a substrate;
   performing a planarization process to the first polysilicon layer;
   performing a first etching back process to the first polysilicon layer after the planarization process, wherein the first polysilicon layer has a first thickness after the planarization process and before the first etching process;
   performing a second etching back process to the first polysilicon layer after the first etching back process, wherein the thickness of the first polysilicon layer is reduced by the second etching back process, wherein the first polysilicon layer has a second thickness after the first etching back process and before the second etching back process, the first polysilicon layer has a third thickness after the second etching back process, and the difference between the first thickness and the second thickness is smaller than the difference between the second thickness and the third thickness; and
   performing a first wet clean process to the first polysilicon layer after the first etching back process and before the second etching back process.

2. The manufacturing method according to claim 1, wherein a solution used in the first wet clean process comprises dilute hydrofluoric acid (DHF) or sulfuric acid.

3. The manufacturing method according to claim 1, further comprising:
   performing a first patterning process to the first polysilicon layer after the second etching back process, wherein at least a part of the first polysilicon layer is patterned to be a floating gate.

4. The manufacturing method according to claim 1, further comprising:
   forming a dielectric layer on the first polysilicon layer after the second etching back process; and
   forming a second polysilicon layer on the dielectric layer.

5. The manufacturing method according to claim 4, wherein the dielectric layer comprises an oxide-nitride-oxide (ONO) multilayered structure.

6. The manufacturing method according to claim 4, further comprising:
   performing a second patterning process to the second polysilicon layer, wherein at least a part of the second polysilicon layer is patterned to be a control gate.

7. The manufacturing method according to claim 1, further comprising:
   performing a second wet clean process to the first polysilicon layer after the planarization process and before the first etching back process.

8. The manufacturing method according to claim 7, wherein a solution used in the second wet clean process comprises sulfuric acid and hydrogen peroxide.

9. The manufacturing method according to claim 1, wherein the planarization process comprises a chemical mechanical polishing (CMP) process.

10. The manufacturing method according to claim 1, wherein a particle at least partially embedded in the first polysilicon layer is formed after the planarization process and before the first etching back process.

11. The manufacturing method according to claim 10, wherein the particle at least partially embedded in the first polysilicon layer is further exposed by the first etching back process and removed by the first wet clean process.

\* \* \* \* \*

UNITED STATES PATENT AND TRADEMARK OFFICE
CERTIFICATE OF CORRECTION

PATENT NO. : 10,141,194 B1
APPLICATION NO. : 15/603465
DATED : November 27, 2018
INVENTOR(S) : Zhi Qiang Mu et al.

Page 1 of 1

It is certified that error appears in the above-identified patent and that said Letters Patent is hereby corrected as shown below:

On the Title Page

Item (73), correct the name of the assignee from "UNITED MICROELETRONICS CORP." to --UNITED MICROELECTRONICS CORP.--.

Signed and Sealed this
Twenty-second Day of January, 2019

Andrei Iancu
*Director of the United States Patent and Trademark Office*